US012587087B2

(12) United States Patent
Rossi et al.

(10) Patent No.: US 12,587,087 B2
(45) Date of Patent: Mar. 24, 2026

(54) CROSS-COUPLED CHARGE PUMP FOR DRIVING A BOOTSTRAP SWITCH

(71) Applicant: STMicroelectronics International N.V., Geneva (CH)

(72) Inventors: Sandro Rossi, Pavia (IT); Alessandro Saccà, Milan (IT); Niccolò Brambilla, San Donato Milanese (IT); Valeria Bottarel, Novara (IT)

(73) Assignee: STMicroelectronics International N.V., Geneva (CH)

( * ) Notice: Subject to any disclaimer, the term of this patent is extended or adjusted under 35 U.S.C. 154(b) by 280 days.

(21) Appl. No.: 18/480,332

(22) Filed: Oct. 3, 2023

(65) Prior Publication Data

US 2025/0112542 A1     Apr. 3, 2025

(51) Int. Cl.
| | |
|---|---|
| *H02M 1/08* | (2006.01) |
| *H02M 3/157* | (2006.01) |
| *H02M 3/158* | (2006.01) |
| *H03K 17/687* | (2006.01) |
| *H03K 19/20* | (2006.01) |

(52) U.S. Cl.
CPC ............. *H02M 1/08* (2013.01); *H02M 3/157* (2013.01); *H02M 3/158* (2013.01); *H03K 17/6871* (2013.01); *H03K 19/20* (2013.01)

(58) Field of Classification Search
CPC ........ H02M 1/08; H02M 3/157; H02M 3/158; H02M 1/0006; H03K 17/6871; H03K 19/20
See application file for complete search history.

(56) References Cited

U.S. PATENT DOCUMENTS

| | | | |
|---|---|---|---|
| 10,749,350 B2 | 8/2020 | Pagano | |
| 12,088,191 B1 * | 9/2024 | Torti ........................ | H02M 3/07 |
| 12,334,811 B2 * | 6/2025 | Brambilla ............. | H02M 1/088 |
| 2014/0062449 A1 | 3/2014 | Qu | |
| 2015/0077081 A1 * | 3/2015 | Ejury .................... | H02M 3/158 |
| | | | 327/109 |
| 2015/0288355 A1 | 10/2015 | Lau | |
| 2016/0359409 A1 | 12/2016 | Theoduloz | |

FOREIGN PATENT DOCUMENTS

| | | |
|---|---|---|
| CN | 111162665 A | 5/2020 |

* cited by examiner

*Primary Examiner* — Kyle J Moody
(74) *Attorney, Agent, or Firm* — Slater Matsil, LLP

(57) ABSTRACT

According to an embodiment, a bootstrap drive circuit for driving a bootstrap switch in a DC-DC converter is proposed. The bootstrap drive circuit includes a non-overlapping circuit, a first and a second capacitor, and a first and a second n-channel transistor. The non-overlapping circuit is configured to receive an input signal, the input signal being a function of a pulse width modulated (PWM) signal, wherein the input signal and the PWM signal are characterized by a first logic level, generate a first control signal from the input signal at a first output terminal of the non-overlapping circuit, the first control signal having the first logic level, and generate a second control signal from the input signal at a second output terminal of the non-overlapping circuit, the second control signal being characterized by a second logic level different from the first logic level.

20 Claims, 5 Drawing Sheets

- PRIOR ART -

700

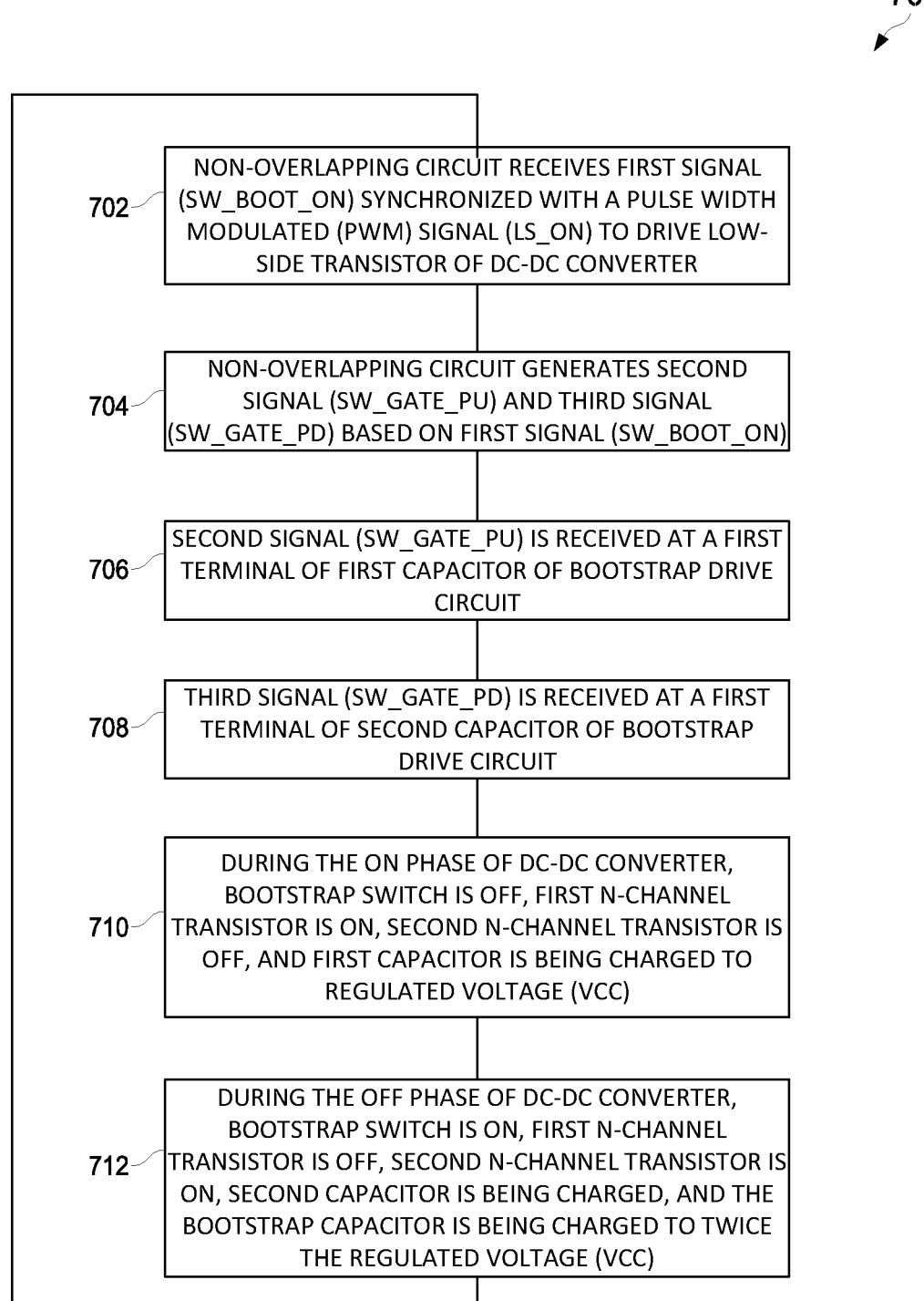

702 — NON-OVERLAPPING CIRCUIT RECEIVES FIRST SIGNAL (SW_BOOT_ON) SYNCHRONIZED WITH A PULSE WIDTH MODULATED (PWM) SIGNAL (LS_ON) TO DRIVE LOW-SIDE TRANSISTOR OF DC-DC CONVERTER

704 — NON-OVERLAPPING CIRCUIT GENERATES SECOND SIGNAL (SW_GATE_PU) AND THIRD SIGNAL (SW_GATE_PD) BASED ON FIRST SIGNAL (SW_BOOT_ON)

706 — SECOND SIGNAL (SW_GATE_PU) IS RECEIVED AT A FIRST TERMINAL OF FIRST CAPACITOR OF BOOTSTRAP DRIVE CIRCUIT

708 — THIRD SIGNAL (SW_GATE_PD) IS RECEIVED AT A FIRST TERMINAL OF SECOND CAPACITOR OF BOOTSTRAP DRIVE CIRCUIT

710 — DURING THE ON PHASE OF DC-DC CONVERTER, BOOTSTRAP SWITCH IS OFF, FIRST N-CHANNEL TRANSISTOR IS ON, SECOND N-CHANNEL TRANSISTOR IS OFF, AND FIRST CAPACITOR IS BEING CHARGED TO REGULATED VOLTAGE (VCC)

712 — DURING THE OFF PHASE OF DC-DC CONVERTER, BOOTSTRAP SWITCH IS ON, FIRST N-CHANNEL TRANSISTOR IS OFF, SECOND N-CHANNEL TRANSISTOR IS ON, SECOND CAPACITOR IS BEING CHARGED, AND THE BOOTSTRAP CAPACITOR IS BEING CHARGED TO TWICE THE REGULATED VOLTAGE (VCC)

FIG. 7

CROSS-COUPLED CHARGE PUMP FOR DRIVING A BOOTSTRAP SWITCH

TECHNICAL FIELD

The present disclosure generally relates to DC-DC converters and, in particular embodiments, to a circuit, system, and method for driving a bootstrap switch in a DC-DC converter.

BACKGROUND

A DC-DC converter is an electronic circuit that converts a DC voltage from one level to another. It works by using a switching element (such as a transistor) to chop the input voltage into a series of pulses (these pulses are generated at the SW pin). These pulses are then filtered and smoothed to produce a DC output voltage at the desired level.

FIG. 1 illustrates a schematic of a conventional DC-DC converter 100. The DC-DC converter includes high-side drive circuitry 102, a high-side transistor 104, low-side drive circuitry 106, a low-side transistor 108, an internal diode 110, an external bootstrap capacitor 114, an output capacitor 116, and an inductor 118. In the DC-DC converter 100, the control circuitry 112 alternately drives the high-side transistor 104 and the low-side transistor 108 ON and OFF, respectively, via the high-side signal (HS_ON) and the low-side signal (LS_ON) to create a desired output voltage ($V_{out}$). A voltage regulator 120 is configured to receive the input voltage ($V_{in}$) and generate a regulated voltage ($V_{cc}$), provided to the internal diode 110 and the low-side drive circuitry 106. The output capacitor 116 and inductor 118 form an LC circuit at the output of the DC-DC converter 100 to produce the desired DC output voltage.

The internal diode 110 and the external bootstrap capacitor 114 form a bootstrap circuit to generate a boosted voltage (i.e., greater or equal to the minimum gate-source voltage ($V_{gs}$) of the high-side transistor 104) and efficiently drive the high-side transistor 104 by the high-side drive circuitry 102.

Generally, the low-side transistor 108 is directly controlled using control circuitry 112 coupled to the input of the low-side drive circuitry 106. However, directly controlling the high-side transistor 104 by control circuitry 112 becomes more challenging because the source terminal of the high-side transistor 104, when the high-side transistor 104 is implemented, for example, as an n-channel Metal-Oxide-Semiconductor Field-Effect Transistor (MOSFET) in a buck converter, is not connected to a ground reference.

During the ON state of the low-side transistor 108 (i.e., OFF phase of the converter), the switching node (SW) is connected to ground. The external bootstrap capacitor 114 is charged to a voltage equal to the difference between the regulated voltage ($V_{cc}$) and the threshold voltage of the internal diode 110 as current flows through the internal diode 110 from the regulated voltage ($V_{cc}$). The internal diode 110 is forward biased and will charge the external bootstrap capacitor 114 to a voltage slightly below the regulated voltage ($V_{cc}$).

During the ON state of the high-side transistor 104 (i.e., ON phase of the converter), the gate voltage of the high-side transistor 104 must be raised above the source voltage level by at least a threshold voltage to ensure it turns entirely ON. However, since the source of the high-side transistor 104 is not connected to the ground reference, it is challenging to drive it directly from the control circuitry 112.

The bootstrap circuit comes into play during this ON state of the high-side transistor 104. The control circuitry 112 asserts the high-side signal (HS_ON), which allows the voltage stored in the charged external bootstrap capacitor 114 to be applied to the control terminal of the high-side transistor 104 through the high-side driver circuitry 102. Applying the voltage from the external bootstrap capacitor 114 to the control terminal of the high-side transistor 104 makes the gate-source voltage ($V_{gs}$) sufficient to turn ON the high-side transistor 104.

Once the high-side transistor 104 is ON, the switching node (SW) is connected to the input power supply ($V_{in}$). The cathode of the internal diode 110 (bootstrap power supply) is equal to the sum of input power supply ($V_{in}$) and the charge stored across the external bootstrap capacitor 114. The internal diode is reverse biased, and the external bootstrap capacitor is disconnected from the regulated voltage ($V_{cc}$). The cycle is continuously repeated as the high-side transistor 104 turns OFF, and the external bootstrap capacitor 114 gets recharged during the ON state of the low-side transistor 108.

Disadvantageously, using the internal diode 110 introduces inefficiencies such as voltage drops due to its inherent electrical characteristics. Conventionally, an active switch has been used to resolve this issue. However, when an n-channel transistor is used as the active switch in the bootstrap circuit, it requires a voltage equal to or greater than the sum of the regulated voltage ($V_{cc}$) and threshold voltage ($V_T$) of the n-channel transistor. A bootstrap drive circuit to drive an n-channel type bootstrap switch that efficiently drives the high-side transistor in a DC-DC converter without the deficiencies in the conventional solutions is, thus, desirable.

SUMMARY

Technical advantages are generally achieved by embodiments of this disclosure which describe a circuit, system, and method for driving a bootstrap switch in a DC-DC converter.

A first aspect relates to a bootstrap drive circuit for driving a bootstrap switch in a DC-DC converter is proposed. The bootstrap drive circuit includes a non-overlapping circuit, a first and a second capacitor, and a first and a second n-channel transistor. The non-overlapping circuit is configured to receive an input signal, the input signal being a function of a pulse width modulated (PWM) signal, wherein the input signal and the PWM signal are characterized by a first logic level, generate a first control signal from the input signal at a first output terminal of the non-overlapping circuit, the first control signal having the first logic level, and generate a second control signal from the input signal at a second output terminal of the non-overlapping circuit, the second control signal being characterized by a second logic level different from the first logic level. The first capacitor is coupled to the first output terminal of the non-overlapping circuit. The second capacitor is coupled to the second output terminal of the non-overlapping circuit. The first n-channel transistor has a control terminal coupled to the second output terminal of the non-overlapping circuit through the second capacitor. A drain terminal of the first n-channel transistor is coupled to a control terminal of the bootstrap switch. A source terminal of the first n-channel transistor is coupled to a source terminal of the bootstrap switch. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch.

A second aspect relates to a DC-DC converter that includes a high-side transistor of an n-channel type, a low-side transistor of the n-channel type, a bootstrap switch, a bootstrap capacitor coupled to the bootstrap switch, and a bootstrap drive circuit for driving the bootstrap switch. A drain terminal of the high-side transistor is coupled to an input supply voltage. A drain terminal of the low-side transistor is coupled to a source terminal of the high-side transistor to provide an output voltage and a source terminal of the low-side transistor is coupled to reference ground. The bootstrap drive circuit includes a non-overlapping circuit, a first and a second capacitor, and a first and a second n-channel transistor. The non-overlapping circuit is configured to receive an input signal, the input signal being a function of a pulse width modulated (PWM) signal, wherein the input signal and the PWM signal are characterized by a first logic level, generate a first control signal from the input signal at a first output terminal of the non-overlapping circuit, the first control signal having the first logic level, and generate a second control signal from the input signal at a second output terminal of the non-overlapping circuit, the second control signal being characterized by a second logic level different from the first logic level. The first capacitor is coupled to the first output terminal of the non-overlapping circuit. The second capacitor is coupled to the second output terminal of the non-overlapping circuit. The first n-channel transistor has a control terminal coupled to the second output terminal of the non-overlapping circuit through the second capacitor. A drain terminal of the first n-channel transistor is coupled to a control terminal of the bootstrap switch. A source terminal of the first n-channel transistor is coupled to a source terminal of the bootstrap switch. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch.

A third aspect relates to a method for driving a bootstrap switch in a DC-DC converter using a bootstrap drive circuit. The method includes receiving, by a non-overlapping circuit of the bootstrap drive circuit, an input signal. The input signal is a function of a pulse width modulated (PWM) signal. The input signal and the PWM signal are characterized by a first logic level. The method further includes generating, by the non-overlapping circuit, a first control signal from the input signal at a first output terminal of the non-overlapping circuit. The first control signal has the first logic level. The method further includes generating, by the non-overlapping circuit, a second control signal from the input signal at a second output terminal of the non-overlapping circuit. The second control signal is characterized by a second logic level different from the first logic level. The method further includes charging a first capacitor of the bootstrap drive circuit to a regulated voltage during an ON phase of the DC-DC converter in accordance with the second control signal. The first capacitor is coupled to the first output terminal of the non-overlapping circuit. The method further includes turning ON a first n-channel transistor of the bootstrap drive circuit during the ON phase of the DC-DC converter. The first n-channel transistor has a control terminal coupled to the second output terminal of the non-overlapping circuit through a second capacitor of the bootstrap drive circuit. A drain terminal of the first n-channel transistor coupled to a control terminal of the bootstrap switch. A source terminal of the first n-channel transistor coupled to a source terminal of the bootstrap switch. The method further includes turning OFF a second n-channel transistor of the bootstrap drive circuit during the ON phase of the DC-DC converter. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch. The method further includes turning OFF the first n-channel transistor during the OFF phase of the DC-DC converter. The control terminal of the bootstrap switch receives twice the regulated voltage during the OFF phase of the DC-DC converter. The method further includes turning ON the second n-channel transistor during the OFF phase of the DC-DC converter.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 7 is a flow chart of an embodiment method for driving the bootstrap switch in the DC-DC converter of FIG. 6 using the bootstrap drive circuit.

DETAILED DESCRIPTION OF ILLUSTRATIVE EMBODIMENTS

Figure 1:
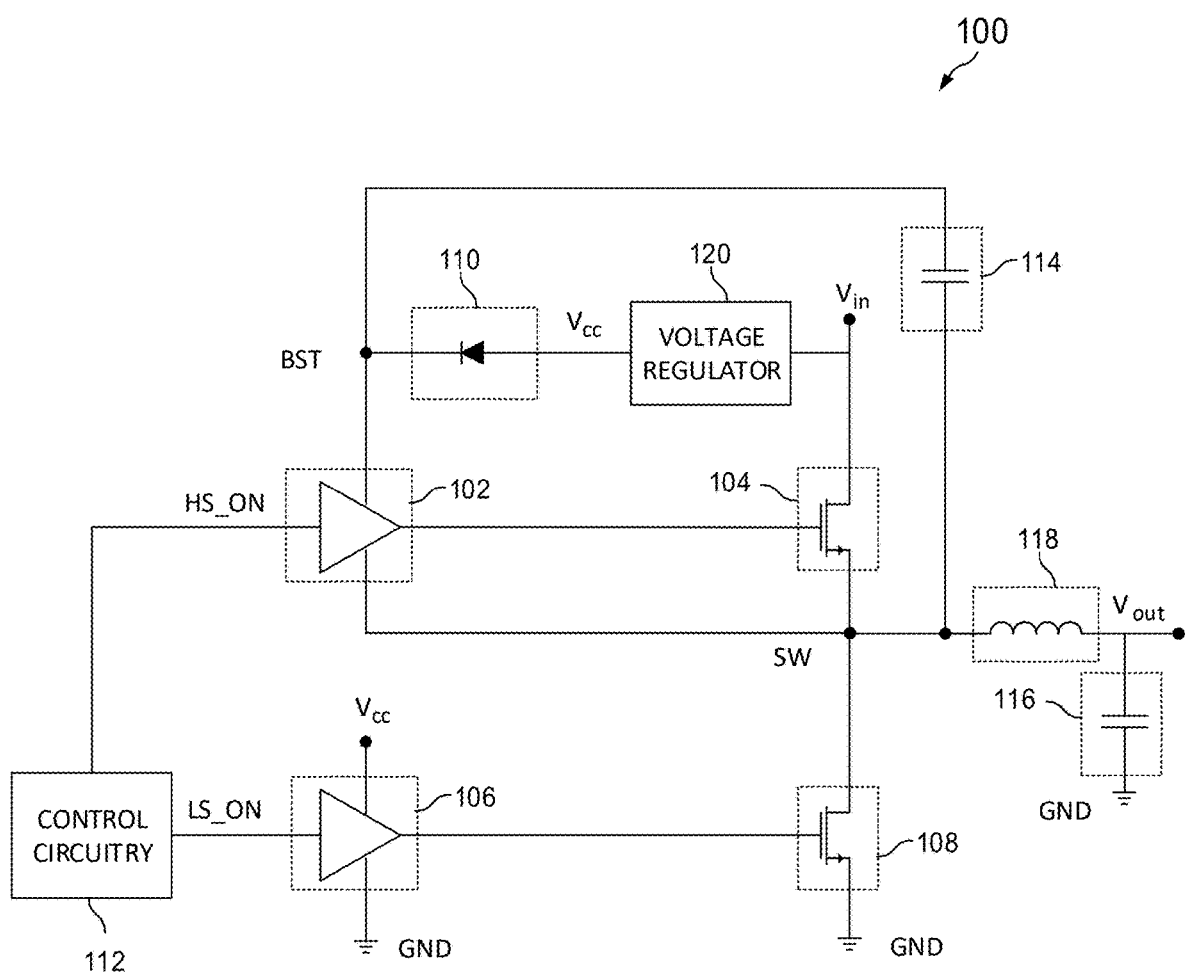
FIG. 1 is a schematic of a conventional DC-DC converter.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a bootstrap drive circuit for driving a bootstrap switch in a DC-DC converter, it should also be appreciated that these inventive aspects may also apply to a switching DC-DC converter with a high-side transistor of the n-channel power MOSFET type. For example, embodiments of this disclosure can be applied to a buck converter with a half-bridge implemented using two n-channel power MOSFETs.

Herein, logic level refers to a specific voltage or signal state representing a binary value, typically a 0 or a 1. Logic levels convey and process information within digital circuits and systems. The two most common logic levels are (i) Low Logic Level (0) and (ii) High Logic Level (1). Low logic level typically represents a voltage near 0 volts or a signal state that is interpreted as "false," "off," or "0." It indicates the absence or very low intensity of the electrical signal. High logic level typically represents a voltage near the maximum supply voltage or a signal state that is interpreted as "true," "on," or "1." It indicates the presence of a significant intensity of the electrical signal.

A bootstrap drive circuit for driving an active bootstrap switch in a DC-DC converter and the circuit's operation method is proposed. In embodiments, the bootstrap drive circuit includes a non-overlapping circuit that receives a first signal synchronized with the pulse width modulated (PWM) signal for driving the low-side and the high-side transistors of the DC-DC converter. Advantageously, the proposed bootstrap drive circuit does not require a clock signal or a level shifter, as the first signal is derived from and synchronized with the signal used to drive the low-side transistor of the DC-DC converter.

The non-overlapping circuit generates second (i.e., control) and third (i.e., complementary control) signals from the first (i.e., sync) signal. The second signal follows the logic levels of the first signal, and the third signal is complementary to the second signal. The second and third signals are received, respectively, at the first terminal of the first capacitor and the second capacitor of the bootstrap drive circuit. In embodiments, a set-reset latch is used for the non-overlapping circuit.

During the ON phase of the DC-DC converter, the second capacitor is charged and the first capacitor is being charged to a regulated voltage ($V_{cc}$) of the input supply voltage ($V_{in}$), as the third signal is at a logic level high and the first and second signals are at a logic level low. A first n-channel transistor of the bootstrap drive circuit is turned ON, a second n-channel transistor of the bootstrap drive circuit is turned OFF, and the bootstrap switch is turned OFF (i.e., the control terminal of the bootstrap switch is at the regulated voltage ($V_{cc}$).

During the OFF phase of the DC-DC converter, the second capacitor is being charged for the next cycle, as the third signal is at a logic level low and the first and second signals are at a logic level high. The first n-channel transistor is turned OFF, the second n-channel transistor is turned ON, and the bootstrap switch is turned ON. During this phase, the control terminal of the bootstrap switch 220 ($M_3$) receives twice the regulated voltage ($2\times V_{ee}$), as the voltage across the first capacitor cannot change instantaneously. The bootstrap capacitor is being charged to twice the regulated voltage ($2\times V_{ee}$). The operation is repeated at each ON and OFF cycle of the DC-DC converter.

Embodiments of this disclosure advantageously exploit the duty cycle of the PWM signal as a clock signal to synchronize the operation of the bootstrap drive circuit for driving the active bootstrap switch in the DC-DC converter. Thus, the disclosure provides an efficient (e.g., low power consumption), low-cost, and minimal complexity boot drive circuit to drive the bootstrap switch. Moreover, the disclosure includes a bootstrap drive circuit that can provide filtering capacitance to the regulated voltage $V_{cc}$ during the ON and OFF phases of the DC-DC converter in standard and cap-less solutions.

Aspects of the disclosure provide a first n-channel transistor with a common terminal to a second terminal of the second capacitor. A drain terminal of the first n-channel transistor is coupled to a control terminal of the bootstrap switch. A source terminal of the first n-channel transistor is coupled to a source terminal of the bootstrap switch. The second n-channel transistor has a control terminal coupled to a second terminal of the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch. These and other details are further detailed below.

Figure 2:
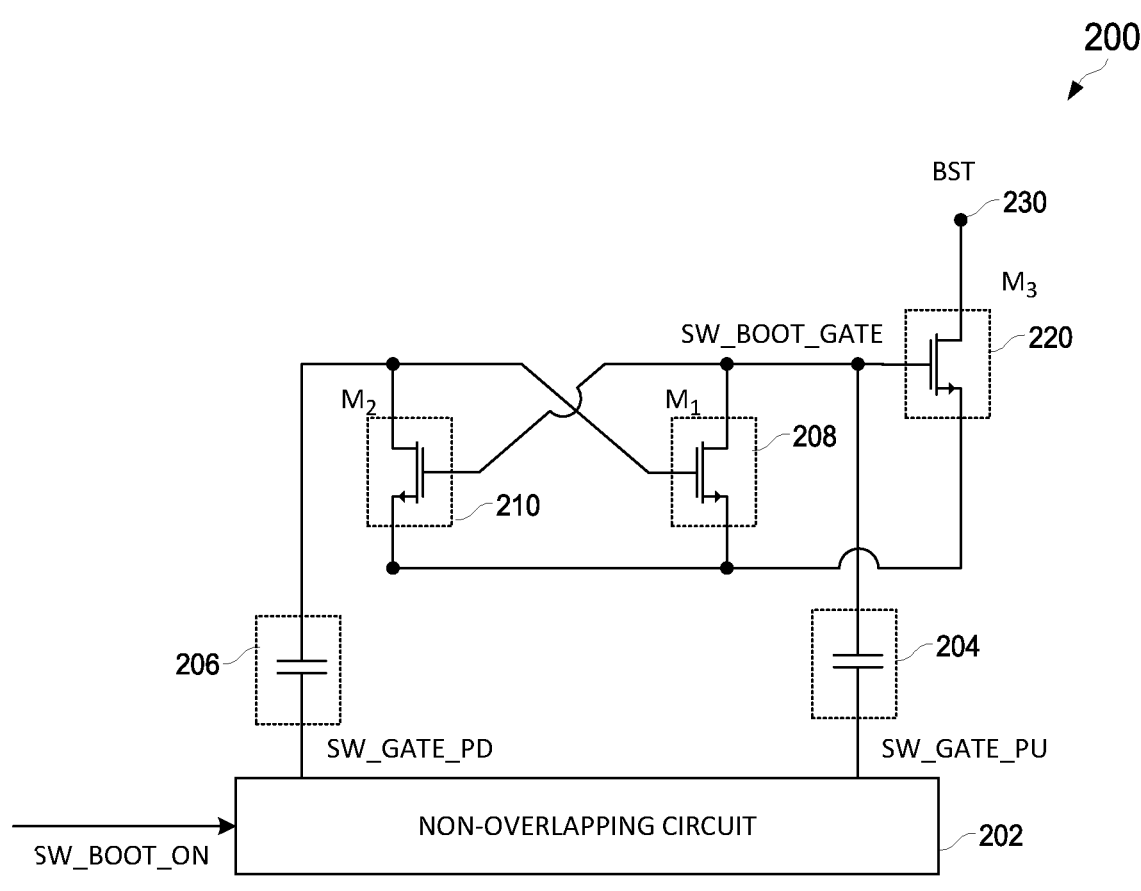
FIG. 2 is a schematic of an embodiment bootstrap drive circuit.

FIG. 2 illustrates a schematic of an embodiment bootstrap drive circuit 200. The bootstrap drive circuit 200 includes a non-overlapping circuit 202, a first capacitor ($C_1$) 204, a second capacitor ($C_2$) 206, a first transistor 208 ($M_1$), and a second transistor 210 ($M_2$), which may (or may not) be arranged as shown. The bootstrap drive circuit 200 may include additional components not shown, such as the voltage regulator 120 coupled to the input voltage ($V_{in}$) supply.

In embodiments, the bootstrap drive circuit 200 is implemented in a switched mode power supply (SMPS) of the buck DC-DC converter (i.e., buck converter) type. In embodiments, the buck converter includes a half-bridge with two n-channel power MOSFETs (i.e., high-side and low-side transistors).

The bootstrap switch 220 is an active bootstrap, also known as a bootstrapped driver. In bootstrap switch 220, instead of using the internal diode 110, an n-channel transistor is used to control the charging process. During the OFF phase of the DC-DC converter, the bootstrap switch 220 enables the regulated voltage ($V_{cc}$) to charge the external bootstrap capacitor 114. During the ON phase of the DC-DC converter, the charge stored in the bootstrap capacitor allows a higher voltage signal to drive the control terminal that would otherwise be difficult to drive due to its voltage reference. Further, the bootstrap switch protects the regulated voltage ($V_{cc}$) from the bootstrap voltage (BST)— the bootstrap voltage (BST) increases from the regulated voltage ($V_{cc}$) to the sum of the regulated voltage ($V_{cc}$) and the input voltage ($V_{in}$). In embodiments, the bootstrap voltage (BST) drives the control terminal of a high-side n-channel type MOSFET through the high-side MOSFET driver. The bootstrap switch 220 with the n-channel transistor advantageously provides improved control and reduced voltage drop compared to the internal diode 110.

In embodiments, the bootstrap drive circuit 200 is configured to generate a voltage equal to twice the regulated voltage ($V_{cc}$) and synchronously turn ON the bootstrap switch 220 during the OFF phase of the DC-DC converter corresponding to the ON state of the low-side transistor 108 and charge the bootstrap capacitor 114.

The non-overlapping circuit 202 is configured to receive a first signal (SW_BOOT_ON) and generate a complementary logic signal (i.e., non-overlapping pair of latched logic signals) that includes a second signal (SW_GATE_PU) and a third signal (SW_GATE_PD). The second signal (SW_GATE_PU) and the third signal (SW_GATE_PD) are logical complements.

Figure 6:
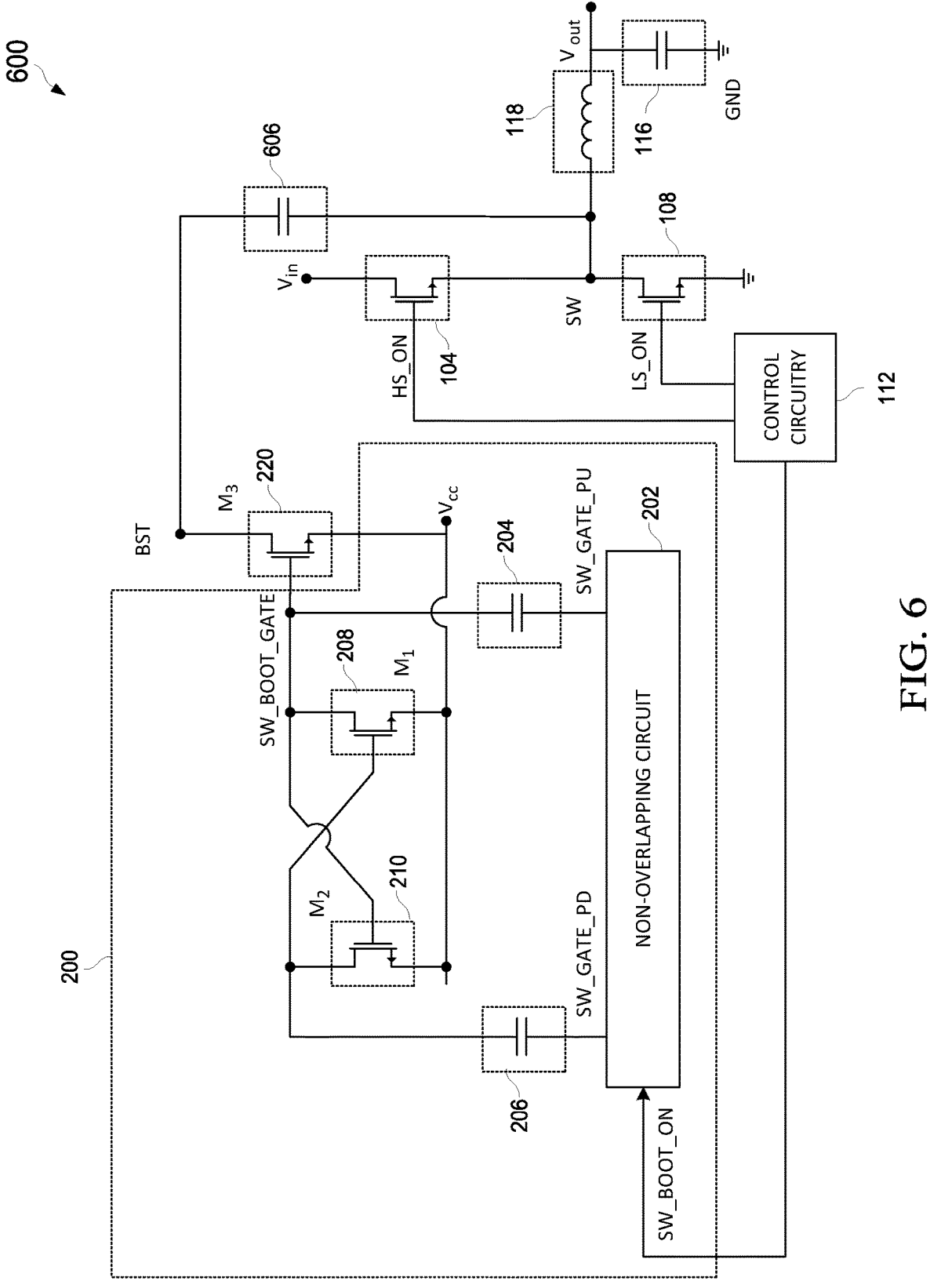
FIG. 6 is a schematic of an embodiment DC-DC converter.

In embodiments, the first signal (SW_BOOT_ON) is derived from the same pulse-width modulated (PWM) control signal (LS_ON) used to drive the control terminal of the low-side transistor 108 and a node (SW_NODE), which is a common node between the bootstrap capacitor 114, the high-side transistor 104, and the low-side transistor 108 (see FIG. 6).

In embodiments, the first signal (SW_BOOT_ON) is derived from the control signal (LS_ON), which is influenced by a digital signal that detects when the switching node (SW) is near the ground level (e.g., see FIG. 3) and when the low-side transistor 108 is effectively turned ON.

In embodiments, the first signal (SW_BOOT_ON) is at a logic level high when the control signal (LS_ON) is at a logic level high, the voltage SW is at a logic level low, and the low-side transistor 108 is turned ON. The first signal (SW_BOOT_ON) is at a logic level low when the control signal (LS_ON) is at a logic level low, the voltage SW is higher than the ground voltage, or the low-side transistor 108 is turned OFF. In embodiments, the first signal (SW_BOOT_ON) is at a logic level high during a window when the control signal (LS_ON) is at a logic level high, the voltage SW is close to the ground voltage reference, and the low-side transistor 108 is turned ON.

In embodiments, the input of the non-overlapping circuit 202 is coupled to a common node between the control circuitry 112 and the control terminal of the low-side transistor 108. In embodiments, the non-overlapping circuit 202 generates the second signal (SW_GATE_PU) to follow the logic level of the first signal (SW_BOOT_ON). In embodiments, the second signal (SW_GATE_PU) follows the logic level of the first signal (SW_BOOT_ON). The non-overlapping circuit 202 generates the third signal (SW_GATE_PD) as a complimentary logic signal to the second signal (SW_GATE_PU).

The second signal (SW_GATE_PU) is coupled to the second transistor 210 control terminal, the first transistor 208 drain terminal, and the bootstrap switch 220 control terminal via the first capacitor 204. The third signal (SW_GATE_PD) is coupled to the control terminal of the first transistor 208 and the drain terminal of the second transistor 210 via the second capacitor 206. The source terminals of the first transistor 208 and the second transistor 210 are coupled to the source terminal of the bootstrap switch 220, which provides the bootstrap voltage (BST) at node 230 to be coupled to the bootstrap capacitor 114.

The first capacitor 204 stores a charge to turn ON the bootstrap switch 220 and the second capacitor 206 stores a charge to turn on the first transistor 208 and recharge the first capacitor 204. The first capacitor size is chosen to drive the bootstrap switch gate; thus, related to the bootstrap switch input capacitor. The second capacitor size is related to the first transistor 208. In embodiments, the first capacitor 204 is magnitudes larger than the second capacitor 206. For example, the first capacitor 204 is at least ten times greater than the second capacitor 206.

The n-channel transistor bootstrap switch 220 controls the charging of the bootstrap capacitor 114. During the ON state of the low-side transistor 108, the n-channel transistor of the bootstrap switch 220 is turned ON by the bootstrap drive circuit 200 and the bootstrap capacitor 114 is charged through the n-channel transistor bootstrap switch 220 to the regulated voltage ($V_{cc}$). During the OFF state of the low-side transistor 108, the n-channel transistor of the bootstrap switch 220 is turned OFF, isolating the bootstrap capacitor 114 from the bootstrap drive circuit 200 and allowing it to hold its charge.

Figure 3:
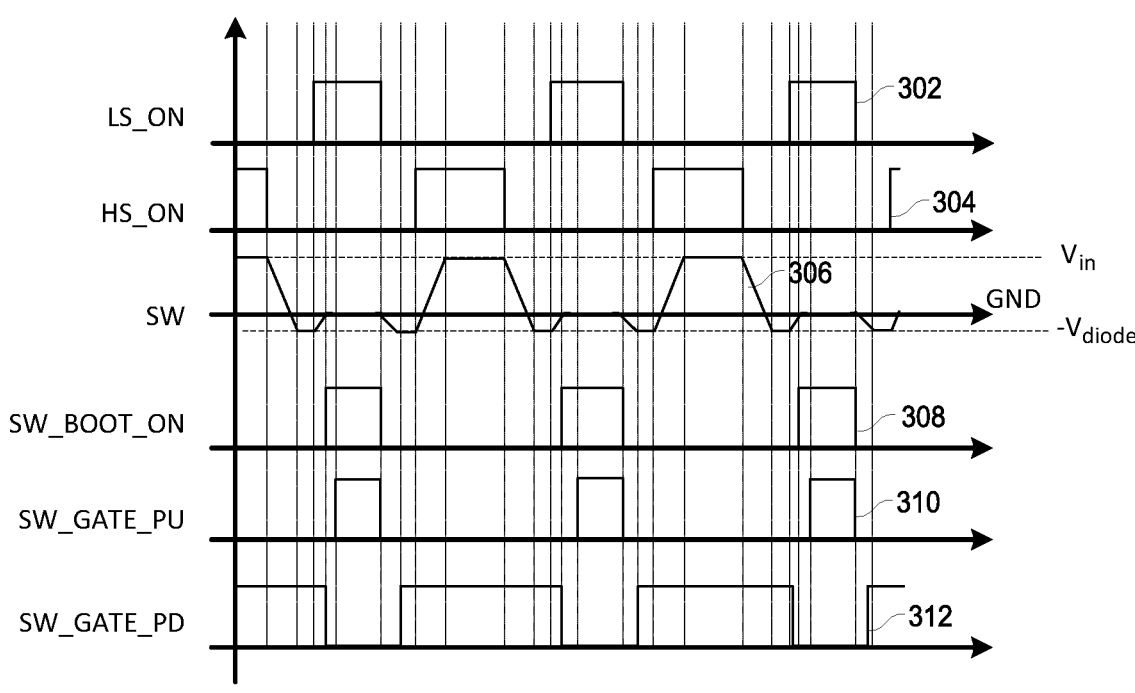
FIG. 3 shows relative timing diagrams of the low-side signal (LS_ON), the high-side signal (HS_ON), the voltage at SW node, the first signal (SW_BOOT_ON), the second signal (SW_GATE_PU), and the third signal (SW_GATE_PD)

FIG. 3 illustrates relative timing diagrams of the low-side signal (LS_ON) 302, the high-side signal (HS_ON) 304, the voltage at SW node 306, the first signal (SW_BOOT_ON) 308, the second signal (SW_GATE_PU) 310, and the third signal (SW_GATE_PD) 312.

The low-side signal (LS_ON) 302 is coupled to the low-side transistor 108 via the low-side drive circuitry 106, generated by the control circuitry 112. The high-side signal (HS_ON) 304 is coupled to the high-side transistor 104 via the high-side drive circuitry 102, generated by the control circuitry 112.

The voltage at SW node 306 corresponds to the voltage at the shared terminals of the high-side transistor 104 and the low-side transistor 108. In embodiments, the voltage at SW node 306 has three voltage levels: (i) input voltage ($V_{in}$) level corresponding to the high-side signal (HS_ON) 304 is at a logic level high (i.e., ON) and the low-side transistor 108 is OFF, (ii) reference ground (GND) level corresponding to the low-side transistor 108 being ON and the high-side transistor 104 being OFF, and (iii) a diode threshold level ($-V_{diode}$) corresponding to the transition between the ON and OFF phases of the DC-DC converter (i.e., dead time during the DC-DC converter's working activity designed to avoid the cross conduction of the high-side transistor 104 and the low-side transistor 108). In embodiments, the voltage at SW node 306 can have a possible fourth voltage level or a high impedance (HiZ) level when the DC-DC converter operates in a Discontinuous Conduction Mode (DCM).

During the transition from the input voltage ($V_{in}$) level to the reference ground (GND) level for the voltage at SW node 306, the low-side transistor 108 remains OFF. Further, the first signal (SW_BOOT_ON) 308 is at a logic level low. The first signal (SW_BOOT_ON) 308 is influenced by a digital signal that detects when the switching node (SW) is near the reference ground (GND) level and when the low-side transistor 108 is completely turned ON. When the low-side transistor 108 is completely turned ON, the voltage at the SW node 306 is at the reference ground (GND) level.

During the ON phase of the DC-DC converter, the voltage at SW node 306 is equal to the input voltage ($V_{in}$) supply, and the low-side transistor 108 is in the OFF state due to the low-side signal (LS_ON) 302 being at a logic level low. The high-side transistor 104 is in the ON state due to the high-side signal (HS_ON) 304 being at a logic level high. The first signal (SW_BOOT_ON) 308 follows the low-side signal (LS_ON) 302; thus, the first signal (SW_BOOT_ON) 308 is at a logic level low. The second signal (SW_GATE_PU) 310 follows the first signal (SW_BOOT_ON) 308; thus, the second signal (SW_GATE_PU) 310 is at a logic level low. As the third signal (SW_GATE_PD) 312 is the logical complement of the second signal (SW_GATE_PU) 310, the third signal (SW_GATE_PD) 312 is at a logic level high.

In contrast, during the OFF phase of the DC-DC converter, the voltage at SW node 306 is at the reference ground (GND) level and the low-side transistor 108 is in the ON state due to the low-side signal (LS_ON) 302 being at a logic level high. The high-side transistor 104 is in the OFF state due to the high-side signal (HS_ON) 304 being at a logic level low. The first signal (SW_BOOT_ON) 308 follows the low-side signal (LS_ON) 302; thus, the first signal (SW_BOOT_ON) 308 is at a logic level high. The second signal (SW_GATE_PU) 310 follows the first signal (SW_BOOT_ON) 308; thus, the second signal (SW_GATE_PU) 310 is at a logic level high. As the third signal (SW_GATE_PD)

312 is the logical complement of the second signal (SW_GATE_PU) 310, the third signal (SW_GATE_PD) 312 is at a logic level low.

Figure 4:
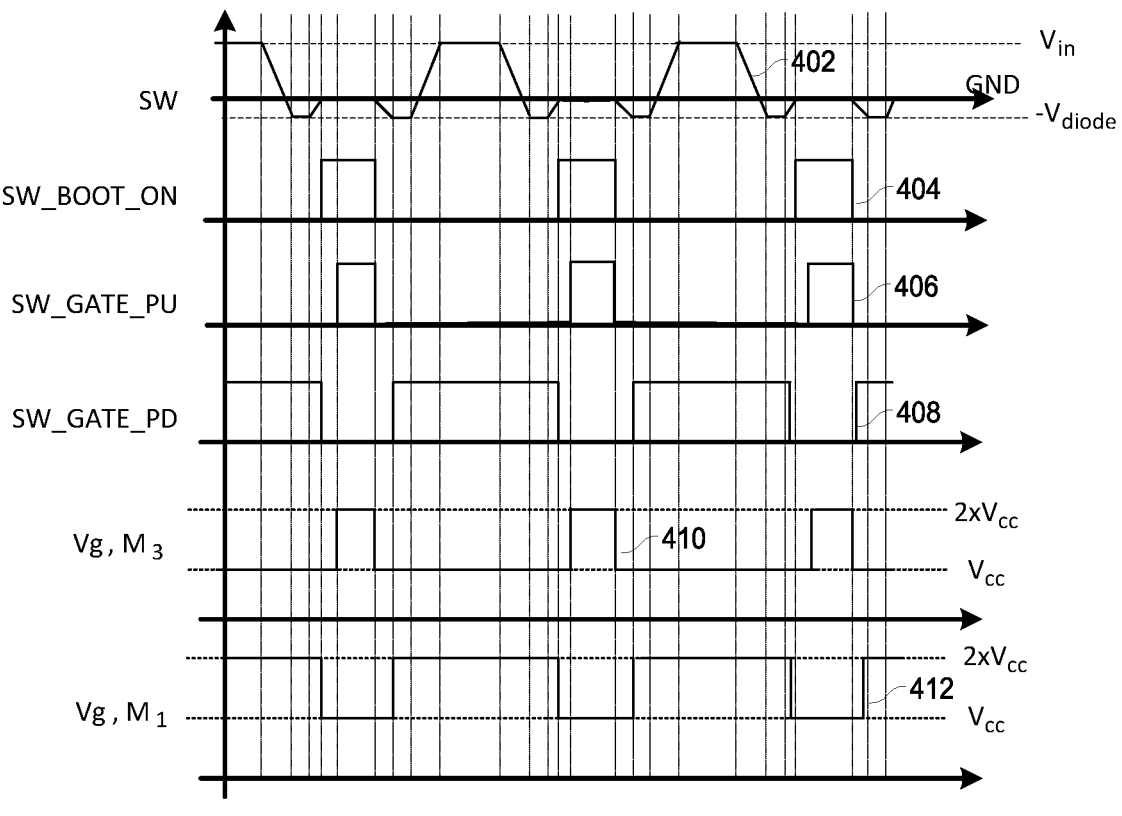
FIG. 4 shows relative timing diagrams of the SW node, the first signal (SW_BOOT_ON), the second signal (SW_GATE_PU), the third signal (SW_GATE_PD), the gate voltage ($V_g$, $M_3$) of the bootstrap switch, and the gate voltage ($V_g$, $M_1$) of the first transistor.

FIG. 4 illustrates relative timing diagrams of the SW node 402, the first signal (SW_BOOT_ON) 404, the second signal (SW_GATE_PU) 406, the third signal (SW_GATE_PD) 408, the gate voltage ($V_g$, $M_3$) 410 of the bootstrap switch 220, and the gate voltage ($V_g$, $M_1$) 412 of the first transistor 208.

During the ON phase of the DC-DC converter, the third signal (SW_GATE_PD) 408 and the gate voltage ($V_g$, $M_1$) 412 of the first transistor 208 are at a logic level high, which results in the first capacitor 204 being charged to the regulated voltage ($V_{cc}$). The second capacitor 206 is charged.

During the OFF phase of the DC-DC converter, the second signal (SW_GATE_PU) 406 and the gate voltage ($V_g$) of the second transistor 210 are at a logic level high and the gate voltage ($V_g$, $M_1$) 412 of the first transistor 208 is at a logic level low. As the voltage across the first capacitor 204 cannot change instantaneously, the first terminal (i.e., terminal coupled to the non-overlapping circuit 202) of the first capacitor 204 is at the regulated voltage ($V_{cc}$). The second terminal (i.e., terminal coupled to the control terminal of the bootstrap switch 220) is at twice the regulated voltage: $2 \times V_{cc} = V_{cc} + \Delta V_{c1}$.

The bootstrap switch 220 is turned on by utilizing the charge stored in the first capacitor 204. During the ON transition, there is a charge sharing between the first capacitor 204 and the input capacitor of the bootstrap switch 220, resulting in some wasted charge. To ensure that at least 90% of the charge is used to turn on the bootstrap switch 220, it is advantageous to select a capacitance value for the first capacitor 209 that is at least nine times greater than the input capacitor of the bootstrap switch 220. This ensures that the charge is utilized efficiently. The first transistor 208 and the first capacitor 204 are chosen to quickly charge the first capacitor 204 during the ON phase of the DC-DC converter and efficiently turn ON the bootstrap switch 220 during the OFF phase of the DC-DC converter. During the ON phase of the DC-DC converter, the control terminal of the bootstrap switch 220 is configured to receive the regulated voltage ($V_{cc}$) and the bootstrap switch 220 is deactivated.

The second transistor 210 and the second capacitor 206 are chosen to quickly charge the second capacitor 206 during the OFF phase of the DC-DC converter and efficiently turn ON the first transistor 208 during the ON phase of the DC-DC converter. During the OFF phase of the DC-DC converter, the control terminal of the bootstrap switch is configured to receive the twice regulated voltage ($2 \times V_{cc}$).

Figure 5:
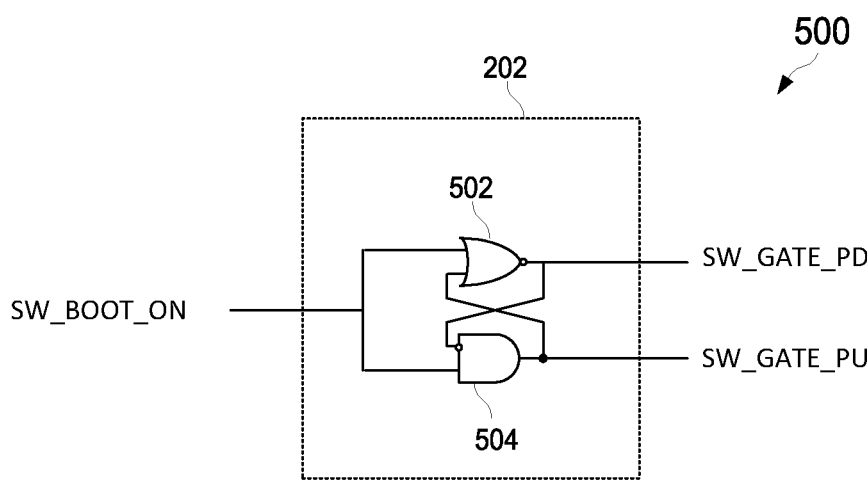
FIG. 5 is a schematic of an embodiment non-overlapping circuit.

FIG. 5 illustrates a schematic of an embodiment non-overlapping circuit 500, which may be implemented as the non-overlapping circuit 202 in FIG. 2. Non-overlapping circuit 500 includes a NOR gate 502 and an AND gate with an inverted input 504, which may (or may not) be arranged as shown.

The first input terminal of the NOR gate 502 is coupled to the first signal (SW_BOOT_ON). The second input of the NOR gate 502 is coupled to the output terminal of the AND gate with the inverted input 504, providing the second signal (SW_GATE_PU).

The non-inverted input terminal of the AND gate with the inverted input 504 is coupled to the first signal (SW_BOOT_ON). The inverted input terminal of the AND gate with the inverted input 504 is coupled to the output terminal of the NOR gate 502, providing the third signal (SW_GATE_PD).

It should be appreciated that the non-overlapping circuit 202 is not limited to the embodiment non-overlapping circuit 500. In other embodiments, a logic gate circuit that provides a pair of complimentary logic signals from a single input is similarly contemplated.

FIG. 6 illustrates a schematic of an embodiment DC-DC converter 600. DC-DC converter 600 includes the bootstrap drive circuit 200, which provides the boosted voltage of $2 \times V_{cc}$ to the bootstrap switch 220 during the OFF phase of the DC-DC converter 600.

DC-DC converter 600 includes a high-side transistor 104, a low-side transistor 108, and a bootstrap capacitor 606. In embodiments, the high-side transistor 104 and the low-side transistor 108 are n-channel MOSFETS.

In embodiments, DC-DC converter 600 is part of a switch-mode power supply (SMPS) of the buck converter type with n-channel power MOSFETs at the high-side transistor 104 and the low-side transistor 108.

Advantageously, embodiments of this disclosure provide a bootstrap drive circuit 200 that generates an output voltage equal to twice the regulated voltage ($V_{cc}$) during the OFF phase of the DC-DC converter to turn ON the bootstrap switch 220 and charge the bootstrap capacitor 606.

The bootstrap drive circuit operates synchronously with the ON and OFF phases of the DC-DC converter without requiring a clock signal or a level shifter. This increases efficiency by minimizing the frequency at which the first capacitor 204 is charged as the output voltage is synchronized with the low-side signal (LS_ON) 302 from the PWM signal of the DC-DC converter 600.

Aspects of this disclosure provide a bootstrap drive circuit 200 that can be utilized in cap-less solutions as well (i.e., no external filtering capacitor on the supply voltage). In embodiments, an external capacitor coupled with the regulated voltage ($V_{cc}$) may also be used.

For example, during the OFF phase of the DC-DC converter, when the low-side signal (LS_ON) 302 is at a logic level high, and the bootstrap switch 220 is switched ON, the bootstrap capacitor 606 is coupled between the regulated voltage ($V_{cc}$) and reference ground, which provides the filtering of the regulated voltage.

During the ON phase of the DC-DC converter, when the high-side signal (HS_ON) 304 is at a logic level high, the first transistor 208 is switched ON, and the bootstrap switch 220 is switched OFF, the first capacitor 204, is coupled between the regulated voltage ($V_{cc}$) and reference ground, which provides the filtering of the regulated voltage.

FIG. 7 illustrates a flow chart of an embodiment method 700 for driving the bootstrap switch 220 in the DC-DC converter 600 using the bootstrap drive circuit 200. It is noted that all steps outlined in the flow chart of method 700 are not necessarily required and can be optional. Further, changes to the arrangement of the steps, removal of one or more steps and path connections, and addition of steps and path connections are similarly contemplated.

At step 702, the non-overlapping circuit 202 of the bootstrap drive circuit 200 receives a first signal (SW_BOOT_ON) synchronized with a pulse width modulated (PWM) signal (LS_ON) for driving the low-side transistor 108 of the DC-DC converter 600.

At step 704, the non-overlapping circuit 202 generates the second signal (SW_GATE_PU) and the third signal (SW_GATE_PD) based on the first signal (SW_BOOT_ON). The second signal (SW_GATE_PU) follows the logic levels of the first signal (SW_BOOT_ON), and the third signal (SW_GATE_PD) is complementary to the second signal (SW_GATE_PU).

At step 706, the second signal (SW_GATE_PU) is received at a first terminal of the first capacitor 204 of the bootstrap drive circuit 200.

At step 708, the third signal (SW_GATE_PD) is received at a first terminal of the second capacitor 206 of the bootstrap drive circuit 200.

At step 710, during the ON phase of the DC-DC converter 600, the first capacitor 204 is being charged to a regulated voltage ($V_{cc}$) of the input supply voltage (Vin) in accordance with the third signal (SW_GATE_PD). The control terminal of the bootstrap switch 220 is at regulated voltage ($V_{cc}$) and is deactivated. The first transistor 208 of the bootstrap drive circuit 200 is turned ON and the second transistor 210 of the bootstrap drive circuit 200 is turned OFF.

The first n-channel transistor 208 has a common terminal to a second terminal of the second capacitor 206. A drain terminal of the first transistor 208 is coupled to a control terminal of the bootstrap switch 220. A source terminal of the first transistor 208 is coupled to a source terminal of the bootstrap switch 220.

The second n-channel transistor 210 has a control terminal coupled to a second terminal of the first capacitor 204 and the drain terminal of the first transistor 208. A drain terminal of the second transistor 210 is coupled to the control terminal of the first transistor 208 and a source terminal of the second transistor 210 is coupled to the source terminal of the bootstrap switch 220.

At step 712, during the OFF phase of the DC-DC converter 600, the first transistor 208 is turned OFF the second n-channel transistor is turned ON. The control terminal of the bootstrap switch 220 receives twice the regulated voltage ($2 \times V_{cc}$) and the bootstrap switch 220 is activated, which causes the bootstrap capacitor 606 to charge to twice the regulated voltage ($2 \times V_{cc}$). The second capacitor 206 is being charged for the next cycle. Steps 702 to 712 are repeated for each ON and OFF cycle of the DC-DC converter.

A first aspect relates to a bootstrap drive circuit for driving a bootstrap switch in a DC-DC converter is proposed. The bootstrap drive circuit includes a non-overlapping circuit, a first and a second capacitor, and a first and a second n-channel transistor. The non-overlapping circuit is configured to receive an input signal, the input signal being a function of a pulse width modulated (PWM) signal, wherein the input signal and the PWM signal are characterized by a first logic level, generate a first control signal from the input signal at a first output terminal of the non-overlapping circuit, the first control signal having the first logic level, and generate a second control signal from the input signal at a second output terminal of the non-overlapping circuit, the second control signal being characterized by a second logic level different from the first logic level. The first capacitor is coupled to the first output terminal of the non-overlapping circuit. The second capacitor is coupled to the second output terminal of the non-overlapping circuit. The first n-channel transistor has a control terminal coupled to the second output terminal of the non-overlapping circuit through the second capacitor. A drain terminal of the first n-channel transistor is coupled to a control terminal of the bootstrap switch. A source terminal of the first n-channel transistor is coupled to a source terminal of the bootstrap switch. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch.

In a first implementation form of the bootstrap drive circuit according to the first aspect as such, the DC-DC converter includes a high-side transistor and a low-side transistor of an n-channel Metal-Oxide-Semiconductor Field-Effect Transistor (MOSFET) type and the PWM signal is a signal used to control an operation of the low-side transistor in the DC-DC converter.

In a second implementation form of the bootstrap drive circuit according to the first aspect as such or any preceding implementation form of the first aspect, the bootstrap switch includes an n-channel transistor.

In a third implementation form of the bootstrap drive circuit according to the first aspect as such or any preceding implementation form of the first aspect, the DC-DC converter further includes a bootstrap capacitor. A first terminal of the bootstrap capacitor is coupled to a drain terminal of the bootstrap switch and a second terminal of the bootstrap capacitor is coupled to a source terminal of the high-side transistor and a drain terminal of the low-side transistor.

In a fourth implementation form of the bootstrap drive circuit according to the first aspect as such or any preceding implementation form of the first aspect, the non-overlapping circuit includes a NOR gate and an AND gate with an inverted input. A first input terminal of the NOR gate is coupled to a sync signal that is synchronized with the PWM signal and a second terminal of the NOR gate is coupled to an output terminal of the AND gate to provide the first control signal. A non-inverted input terminal of the AND gate is coupled to the sync signal and an inverted input terminal of the AND gate is coupled to an output terminal of the NOR gate to provide the second control signal.

In a fifth implementation form of the bootstrap drive circuit according to the first aspect as such or any preceding implementation form of the first aspect, a capacitance of the first capacitor is at least ten times greater in value than a capacitance of the second capacitor.

In a sixth implementation form of the bootstrap drive circuit according to the first aspect as such or any preceding implementation form of the first aspect, the first capacitor, the second capacitor, the first n-channel transistor, and the second n-channel transistor are selected to charge the first capacitor during an ON phase of the DC-DC converter and turn ON the bootstrap switch during the OFF phase of the DC-DC converter.

A second aspect relates to a DC-DC converter that includes a high-side transistor of an n-channel type, a low-side transistor of the n-channel type, a bootstrap switch, a bootstrap capacitor coupled to the bootstrap switch, and a bootstrap drive circuit for driving the bootstrap switch. A drain terminal of the high-side transistor is coupled to an input supply voltage. A drain terminal of the low-side transistor is coupled to a source terminal of the high-side transistor to provide an output voltage and a source terminal of the low-side transistor is coupled to reference ground. The bootstrap drive circuit includes a non-overlapping circuit, a first and a second capacitor, and a first and a second n-channel transistor. The non-overlapping circuit is configured to receive an input signal, the input signal being a function of a pulse width modulated (PWM) signal, wherein the input signal and the PWM signal are characterized by a first logic level, generate a first control signal from the input signal at a first output terminal of the non-overlapping circuit, the first control signal having the first logic level, and generate a second control signal from the input signal at a second output terminal of the non-overlapping circuit, the second control signal being characterized by a second logic level different from the first logic level. The first capacitor is coupled to the first output terminal of the non-overlapping circuit. The second capacitor is coupled to the second output terminal of the non-overlapping circuit. The first n-channel transistor has a control terminal coupled to the second output terminal of the non-overlapping circuit through the second capacitor. A drain terminal of the first n-channel transistor is coupled to a control terminal of the bootstrap switch. A source terminal of the first n-channel transistor is coupled to a source terminal of the bootstrap switch. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch.

In a first implementation form of the DC-DC converter according to the second aspect as such, the DC-DC converter includes a high-side transistor and a low-side transistor of an n-channel Metal-Oxide-Semiconductor Field-Effect Transistor (MOSFET) type. The PWM signal is a signal used to control an operation of the low-side transistor in the DC-DC converter.

In a second implementation form of the DC-DC converter according to the second aspect as such or any preceding implementation form of the second aspect, the bootstrap switch includes an n-channel transistor.

In a third implementation form of the DC-DC converter according to the second aspect as such or any preceding implementation form of the second aspect, the DC-DC converter further includes a bootstrap capacitor. A first terminal of the bootstrap capacitor coupled to a drain terminal of the bootstrap switch and a second terminal of the bootstrap capacitor is coupled to a source terminal of the high-side transistor and a drain terminal of the low-side transistor.

In a fourth implementation form of the DC-DC converter according to the second aspect as such or any preceding implementation form of the second aspect, the non-overlapping circuit includes a NOR gate and an AND gate with an inverted input. A first input terminal of the NOR gate is coupled to a sync signal that is synchronized with the PWM signal and a second terminal of the NOR gate is coupled to an output terminal of the AND gate to provide the first control signal. A non-inverted input terminal of the AND gate is coupled to the sync signal and an inverted input terminal of the AND gate is coupled to an output terminal of the NOR gate to provide the second control signal.

In a fifth implementation form of the DC-DC converter according to the second aspect as such or any preceding implementation form of the second aspect, a capacitance of the first capacitor is at least ten times greater in value than a capacitance of the second capacitor.

In a sixth implementation form of the DC-DC converter according to the second aspect as such or any preceding implementation form of the second aspect, the first capacitor, the second capacitor, the first n-channel transistor, and the second n-channel transistor are selected to charge the first capacitor during an ON phase of the DC-DC converter and turn ON the bootstrap switch during the OFF phase of the DC-DC converter.

A third aspect relates to a method for driving a bootstrap switch in a DC-DC converter using a bootstrap drive circuit.

The method includes receiving, by a non-overlapping circuit of the bootstrap drive circuit, an input signal. The input signal is a function of a pulse width modulated (PWM) signal. The input signal and the PWM signal are characterized by a first logic level. The method further includes generating, by the non-overlapping circuit, a first control signal from the input signal at a first output terminal of the non-overlapping circuit. The first control signal has the first logic level. The method further includes generating, by the non-overlapping circuit, a second control signal from the input signal at a second output terminal of the non-overlapping circuit. The second control signal is characterized by a second logic level different from the first logic level. The method further includes charging a first capacitor of the bootstrap drive circuit to a regulated voltage during an ON phase of the DC-DC converter in accordance with the second control signal. The first capacitor is coupled to the first output terminal of the non-overlapping circuit. The method further includes turning ON a first n-channel transistor of the bootstrap drive circuit during the ON phase of the DC-DC converter. The first n-channel transistor has a control terminal coupled to the second output terminal of the non-overlapping circuit through a second capacitor of the bootstrap drive circuit. A drain terminal of the first n-channel transistor coupled to a control terminal of the bootstrap switch. A source terminal of the first n-channel transistor coupled to a source terminal of the bootstrap switch. The method further includes turning OFF a second n-channel transistor of the bootstrap drive circuit during the ON phase of the DC-DC converter. The second n-channel transistor has a control terminal coupled to the first output terminal of the non-overlapping circuit through the first capacitor and the drain terminal of the first n-channel transistor. A drain terminal of the second n-channel transistor is coupled to the control terminal of the first n-channel transistor. A source terminal of the second n-channel transistor is coupled to the source terminal of the bootstrap switch. The method further includes turning OFF the first n-channel transistor during the OFF phase of the DC-DC converter. The control terminal of the bootstrap switch receives twice the regulated voltage during the OFF phase of the DC-DC converter. The method further includes turning ON the second n-channel transistor during the OFF phase of the DC-DC converter.

In a first implementation form of the method according to the third aspect as such, the DC-DC converter includes a high-side transistor and the low-side transistor of an n-channel Metal-Oxide-Semiconductor Field-Effect Transistor (MOSFET) type. An input terminal of the non-overlapping circuit is coupled to a sync signal used to drive the low-side transistor of the DC-DC converter.

In a second implementation form of the method according to the third aspect as such or any preceding implementation form of the third aspect, the DC-DC converter includes a high-side transistor and a low-side transistor of an n-channel Metal-Oxide-Semiconductor Field-Effect Transistor (MOS-FET) type. The PWM signal is a signal used to control an operation of the low-side transistor in the DC-DC converter.

In a third implementation form of the method according to the third aspect as such or any preceding implementation form of the third aspect, the bootstrap switch includes an n-channel transistor.

In a fourth implementation form of the method according to the third aspect as such or any preceding implementation form of the third aspect, the DC-DC converter further includes a bootstrap capacitor. A first terminal of the bootstrap capacitor is coupled to a drain terminal of the bootstrap switch and a second terminal of the bootstrap capacitor coupled to a source terminal of the high-side transistor and a drain terminal of the low-side transistor.

In a fifth implementation form of the method according to the third aspect as such or any preceding implementation form of the third aspect, the non-overlapping circuit includes a NOR gate and an AND gate with an inverted input. A first input terminal of the NOR gate is coupled to a sync signal that is synchronized with the PWM signal and a second terminal of the NOR gate is coupled to an output terminal of the AND gate to provide the first control signal. A non-inverted input terminal of the AND gate is coupled to the sync signal and an inverted input terminal of the AND gate is coupled to an output terminal of the NOR gate to provide the second control signal.

Although the description has been described in detail, it should be understood that various changes, substitutions, and alterations may be made without departing from the spirit and scope of this disclosure as defined by the appended claims. The same elements are designated with the same reference numbers in the various figures.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A bootstrap drive circuit for driving a bootstrap switch in a DC-DC converter, the bootstrap drive circuit comprising:

a non-overlapping circuit configured to:
receive an input signal, the input signal being a function of a pulse width modulated (PWM) signal, wherein the input signal and the PWM signal are characterized by a first logic level,
generate a first control signal from the input signal at a first output terminal of the non-overlapping circuit, the first control signal having the first logic level, and
generate a second control signal from the input signal at a second output terminal of the non-overlapping circuit, the second control signal being characterized by a second logic level different from the first logic level;
a first capacitor coupled to the first output terminal of the non-overlapping circuit;
a second capacitor coupled to the second output terminal of the non-overlapping circuit;
a first n-channel transistor having a control terminal coupled to the second output terminal of the non-overlapping circuit through the second capacitor, a drain terminal of the first n-channel transistor coupled to a control terminal of the bootstrap switch, a source terminal of the first n-channel transistor coupled to a source terminal of the bootstrap switch; and
a second n-channel transistor having a control terminal coupled to the first output terminal of the non-overlapping circuit through the first capacitor and the drain terminal of the first n-channel transistor, a drain terminal of the second n-channel transistor coupled to the control terminal of the first n-channel transistor, a source terminal of the second n-channel transistor coupled to the source terminal of the bootstrap switch.

2. The bootstrap drive circuit of claim 1, wherein the DC-DC converter includes a high-side transistor and a low-side transistor of an n-channel Metal-Oxide-Semiconductor Field-Effect Transistor (MOSFET) type, the PWM signal being a signal used to control an operation of the low-side transistor in the DC-DC converter.

3. The bootstrap drive circuit of claim 2, wherein the bootstrap switch comprises an n-channel transistor.

4. The bootstrap drive circuit of claim 2, wherein the DC-DC converter further comprises a bootstrap capacitor, a first terminal of the bootstrap capacitor coupled to a drain terminal of the bootstrap switch, and a second terminal of the bootstrap capacitor coupled to a source terminal of the high-side transistor and a drain terminal of the low-side transistor.

5. The bootstrap drive circuit of claim 1, wherein the non-overlapping circuit comprises:

a NOR gate; and
an AND gate with an inverted input,
wherein a first input terminal of the NOR gate is coupled to a sync signal that is synchronized with the PWM signal, a second terminal of the NOR gate is coupled to an output terminal of the AND gate to provide the first control signal, and
wherein a non-inverted input terminal of the AND gate is coupled to the sync signal, an inverted input terminal of the AND gate is coupled to an output terminal of the NOR gate to provide the second control signal.

6. The bootstrap drive circuit of claim 1, wherein a capacitance of the first capacitor is at least ten times greater in value than a capacitance of the second capacitor.

7. The bootstrap drive circuit of claim 1, wherein the first capacitor, the second capacitor, the first n-channel transistor, and the second n-channel transistor are selected to charge the first capacitor during an ON phase of the DC-DC converter and turn ON the bootstrap switch during the OFF phase of the DC-DC converter.

8. A DC-DC converter, comprising:

a high-side transistor of an n-channel type, a drain terminal of the high-side transistor coupled to an input supply voltage;
a low-side transistor of the n-channel type, a drain terminal of the low-side transistor coupled to a source terminal of the high-side transistor to provide an output voltage, a source terminal of the low-side transistor coupled to reference ground;
a bootstrap switch;
a bootstrap capacitor coupled to the bootstrap switch; and
a bootstrap drive circuit for driving the bootstrap switch, the bootstrap drive circuit comprising:
a non-overlapping circuit configured to:
receive an input signal, the input signal being a function of a pulse width modulated (PWM) signal, wherein the input signal and the PWM signal are characterized by a first logic level;
generate a first control signal from the input signal at a first output terminal of the non-overlapping circuit, the first control signal having the first logic level; and
generate a second control signal from the input signal at a second output terminal of the non-overlapping circuit, the second control signal being characterized by a second logic level different from the first logic level, a first capacitor coupled to the first output terminal of the non-overlapping circuit, a second capacitor coupled to the second output terminal of the non-overlapping circuit, a first n-channel transistor having a control terminal coupled to the second output terminal of the non-overlapping circuit through the second capacitor, a drain terminal of the first n-channel transistor coupled to a control terminal of the bootstrap switch, a source terminal of the first n-channel transistor coupled to a source terminal of the bootstrap switch, and a second n-channel transistor having a control terminal coupled to the first output terminal of the non-overlapping circuit through the first capacitor and the drain terminal of the first n-channel transistor, a drain terminal of the second n-channel transistor coupled to the control terminal of the first n-channel transistor, a source terminal of the second n-channel transistor coupled to the source terminal of the bootstrap switch.

9. The DC-DC converter of claim 8, wherein each of the high-side transistor and the low-side transistor is a Metal-Oxide-Semiconductor Field-Effect Transistor (MOSFET) of the n-channel type, the PWM signal being a signal used to control an operation of the low-side transistor in the DC-DC converter.

10. The DC-DC converter of claim 8, wherein the bootstrap switch comprises an n-channel transistor.

11. The DC-DC converter of claim 8, wherein a first terminal of the bootstrap capacitor is coupled to a drain terminal of the bootstrap switch, and a second terminal of the bootstrap capacitor is coupled to a source terminal of the high-side transistor and a drain terminal of the low-side transistor.

12. The DC-DC converter of claim 8, wherein the non-overlapping circuit comprises:

a NOR gate; and an AND gate with an inverted input, wherein a first input terminal of the NOR gate is coupled to a sync signal that is synchronized with the PWM signal, a second terminal of the NOR gate is coupled to an output terminal of the AND gate to provide the first control signal, and wherein a non-inverted input terminal of the AND gate is coupled to the sync signal, an inverted input terminal of the AND gate is coupled to an output terminal of the NOR gate to provide the second control signal.

13. The DC-DC converter of claim 8, wherein a capacitance of the first capacitor is at least ten times greater in value than a capacitance of the second capacitor.

14. The DC-DC converter of claim 8, wherein the first capacitor, the second capacitor, the first n-channel transistor, and the second n-channel transistor are selected to charge the first capacitor during an ON phase of the DC-DC converter and turn ON the bootstrap switch during the OFF phase of the DC-DC converter.

15. A method for driving a bootstrap switch in a DC-DC converter using a bootstrap drive circuit, the method comprising:

receiving, by a non-overlapping circuit of the bootstrap drive circuit, an input signal, the input signal being a function of a pulse width modulated (PWM) signal, wherein the input signal and the PWM signal are characterized by a first logic level;

generating, by the non-overlapping circuit, a first control signal from the input signal at a first output terminal of the non-overlapping circuit, the first control signal having the first logic level;

generating, by the non-overlapping circuit, a second control signal from the input signal at a second output terminal of the non-overlapping circuit, the second control signal being characterized by a second logic level different from the first logic level;

charging a first capacitor of the bootstrap drive circuit to a regulated voltage during an ON phase of the DC-DC converter in accordance with the second control signal, the first capacitor coupled to the first output terminal of the non-overlapping circuit;

turning ON a first n-channel transistor of the bootstrap drive circuit during the ON phase of the DC-DC converter, the first n-channel transistor having a control terminal coupled to the second output terminal of the non-overlapping circuit through a second capacitor of the bootstrap drive circuit, a drain terminal of the first n-channel transistor coupled to a control terminal of the bootstrap switch, a source terminal of the first n-channel transistor coupled to a source terminal of the bootstrap switch;

turning OFF a second n-channel transistor of the bootstrap drive circuit during the ON phase of the DC-DC converter, the second n-channel transistor having a control terminal coupled to the first output terminal of the non-overlapping circuit through the first capacitor and the drain terminal of the first n-channel transistor, a drain terminal of the second n-channel transistor coupled to the control terminal of the first n-channel transistor, a source terminal of the second n-channel transistor coupled to the source terminal of the bootstrap switch;

turning OFF the first n-channel transistor during the OFF phase of the DC-DC converter, the control terminal of the bootstrap switch receiving twice the regulated voltage during the OFF phase of the DC-DC converter; and turning ON the second n-channel transistor during the OFF phase of the DC-DC converter.

16. The method of claim 15, wherein the DC-DC converter includes a high-side transistor and a low-side transistor of an n-channel Metal-Oxide-Semiconductor Field-Effect Transistor (MOSFET) type, and wherein an input terminal of the non-overlapping circuit is coupled to a sync signal used to drive the low-side transistor of the DC-DC converter.

17. The method of claim 15, wherein the DC-DC converter includes a high-side transistor and a low-side transistor of an n-channel Metal-Oxide-Semiconductor Field-Effect Transistor (MOSFET) type, the PWM signal being a signal used to control an operation of the low-side transistor in the DC-DC converter.

18. The method of claim 16, wherein the bootstrap switch comprises an n-channel transistor.

19. The method of claim 16, wherein the DC-DC converter further comprises a bootstrap capacitor, a first terminal of the bootstrap capacitor coupled to a drain terminal of the bootstrap switch, and a second terminal of the bootstrap capacitor coupled to a source terminal of the high-side transistor and a drain terminal of the low-side transistor.

20. The method of claim 15, wherein the non-overlapping circuit comprises:

a NOR gate; and an AND gate with an inverted input, wherein a first input terminal of the NOR gate is coupled to a sync signal that is synchronized with the PWM signal, a second terminal of the NOR gate is coupled to an output terminal of the AND gate to provide the first control signal, and wherein a non-inverted input terminal of the AND gate is coupled to the sync signal, an inverted input terminal of the AND gate is coupled to an output terminal of the NOR gate to provide the second control signal.

* * * * *

20